United States Patent
Chen et al.

(10) Patent No.: US 8,902,017 B2
(45) Date of Patent: Dec. 2, 2014

(54) EQUALIZER AND COMMUNICATION SYSTEM

(75) Inventors: Hsin-Chao Chen, Chiayi (TW);
Chih-Hung Chen, Hsinchu (TW)

(73) Assignee: NOVATEK Microelectronics Corp., Hsinchu Science Park, Hsin-Chu (TW)

( * ) Notice: Subject to any disclaimer, the term of this patent is extended or adjusted under 35 U.S.C. 154(b) by 289 days.

(21) Appl. No.: 13/457,486

(22) Filed: Apr. 27, 2012

(65) Prior Publication Data
US 2012/0294351 A1    Nov. 22, 2012

(30) Foreign Application Priority Data
May 16, 2011    (TW) .............................. 100117032 A

(51) Int. Cl.
*H04L 25/03*    (2006.01)
*H03F 3/45*    (2006.01)

(52) U.S. Cl.
CPC ...... *H03F 3/45197* (2013.01); *H04L 25/03878* (2013.01); *H03F 2203/45488* (2013.01)
USPC .......................... 333/28 R; 375/229; 327/308

(58) Field of Classification Search
USPC ....... 333/28 R, 81 R; 375/232, 229; 327/308, 327/309
See application file for complete search history.

(56) References Cited

FOREIGN PATENT DOCUMENTS

| CN | 101286959 A | 10/2008 |
|---|---|---|
| TW | 200305850 | 11/2003 |
| TW | 200843383 | 11/2008 |

*Primary Examiner* — Stephen Jones
*Assistant Examiner* — Scott S Outten
(74) *Attorney, Agent, or Firm* — Winston Hsu; Scott Margo

(57) ABSTRACT

An equalizer for compensating an input signal in a receiver of a communication system is disclosed. The equalizer includes a first transistor, having a gate for receiving a positive input voltage of the input signal; a second transistor, having a gate for receiving a negative input voltage of the input signal, and a source coupled to a source of the first transistor; and a resistor, connected with at least one capacitor to be coupled between a drain of the first transistor and a drain of the second transistor, for optimizing a resistance of the resistor, to compensate the input signal.

8 Claims, 5 Drawing Sheets

EQUALIZER AND COMMUNICATION SYSTEM

BACKGROUND OF THE INVENTION

1. Field of the Invention

The present invention relates to an equalizer and a communication system, and more particularly, to an equalizer and a communication system capable of compensating a high frequency component of an input signal without decaying a low frequency component of the input signal.

2. Description of the Prior Art

In a High-Definition Multimedia Interface (HDMI™) system or Universal Serial Bus (USB™) system, since a high frequency component of an input signal decays more seriously than a low frequency component of the input signal in a receiver, when the receiver performs analog to digital conversion determined by levels of 0 and 1, eye diagrams are blurred due to more decay in the high frequency component, such that a high voltage level of the input signal can be hardly distinguished from a low voltage level of the input signal and is unable to be decoded.

Under this circumstance, an equalizer is generally set in receiving terminal of a receiver where the receiver receives input signals in the prior art, for performing analog operations with the input signals, to restore the input signals with natural losses to determinable voltage levels for digital logics, such that the restored input signals comply with signals which transmitters intend to transmit and thus can be utilized for following operations.

For example, please refer to FIG. 1, which illustrates a schematic diagram of a communication system 10 of the prior art. As shown in FIG. 1, the communication system 10 comprises a transmitter 102, transmission lines $TL_1$-$TL_x$ and a receiver 104, wherein the communication system 10 can be a HDMI™ system or a USB™ system. The transmitter 102 transmits input signals $IN_1$-$IN_x$, such that transmission lines $TL_1$-$TL_x$ transmit the input signals $IN_1$-$IN_x$ to the receiver 104, respectively. The receiver 104 comprises equalizers $EQ_1$-$EQ_x$ and a processing unit 106. The equalizers $EQ_1$-$EQ_x$ compensate the input signals $IN_1$-$IN_x$, respectively, to restore the input signals $IN_1$-$IN_x$ to determinable voltage levels to be decoded by digital logics, such that the processing unit 106 can process the input signals $IN_1$-$IN_x$ compensated by the equalizers $EQ_1$-$EQ_x$, e.g. an analog process or a digital process.

Therefore, proper designs for the equalizers to compensate the input signals so as to restore the input signals to determinable voltage levels to be decoded by the digital logics have become an issue in industry.

SUMMARY OF THE INVENTION

It is therefore an objective of the present invention to provide an equalizer and a communication system for compensating a high frequency component of an input signal without decaying a low frequency component of the input signal.

The present invention discloses an equalizer for compensating an input signal in a receiver of a communication system, wherein the input signal comprises a high frequency component and a low frequency component, the equalizer comprising a first transistor, comprising a gate, a drain and a source, the gate for receiving a positive input voltage of the input signal; a second transistor, comprising a gate, a drain and a source, the gate for receiving a negative input voltage of the input signal, and the source is coupled to the source of the first transistor; and a resistor, connected with at least one capacitor in series to be coupled between the drain of the first transistor and the drain of the second transistor, for optimizing a resistance of the resistor, to compensate the input signal.

The present invention further discloses a communication system comprises a transmitter for transmitting at least one input signal; at least one transmission line, coupled to the transmitter, for transmitting at least one input signal, respectively; and a receiver comprising at least one equalizer, coupled to the at least one transmission line, respectively, each equalizer for compensating a corresponding input signal, which comprises a high frequency component and a low frequency component, the each equalizer comprising a first transistor, comprising a gate, a drain and a source, the gate for receiving a positive input voltage of the input signal; a second transistor, comprising a gate, a drain and a source, the gate for receiving a negative input voltage of the input signal, and the source is coupled to the source of the first transistor; and a resistor, connected with at least one capacitor in series to be coupled between the drain of the first transistor and the drain of the second transistor, for optimizing a resistance of the resistor, to compensate the input signal; and a processing unit, for compensating the at least one input signal transmitted through the at least one equalizer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
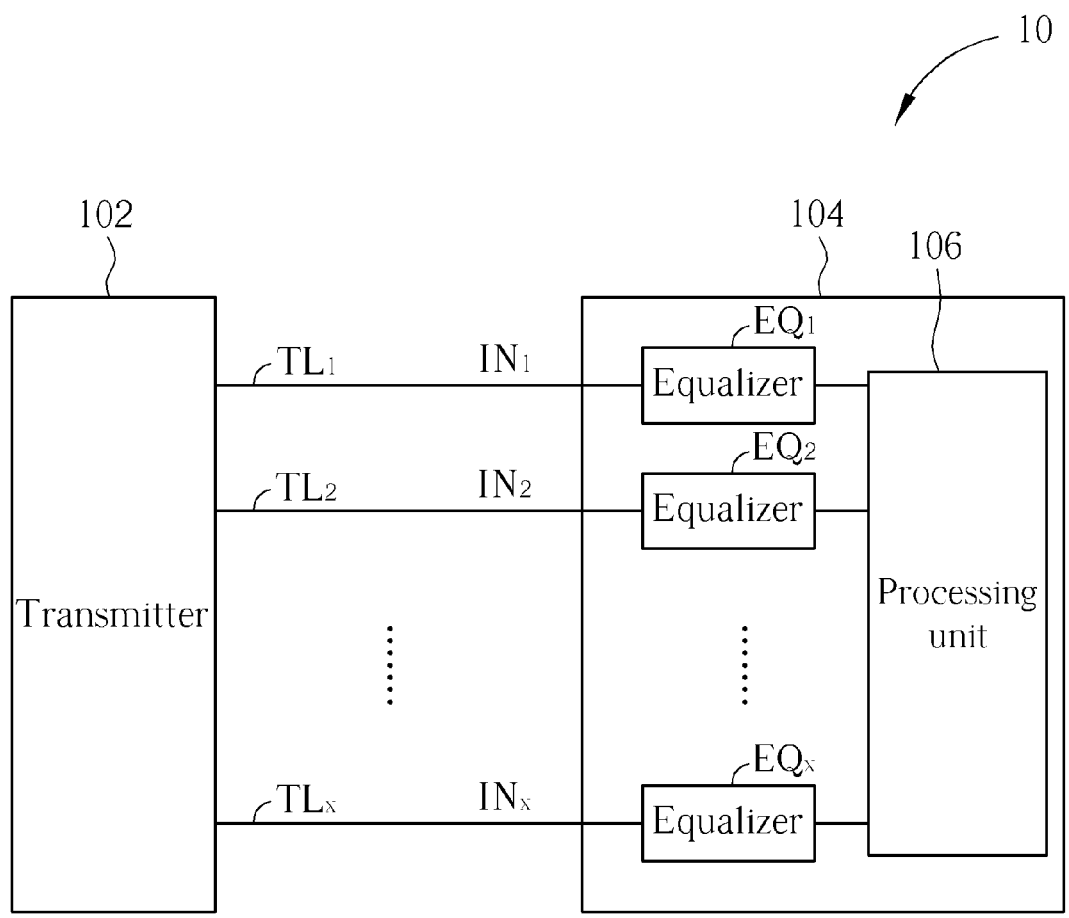
FIG. 1 illustrates a schematic diagram of a communication system of the prior art.
Figure 2B:
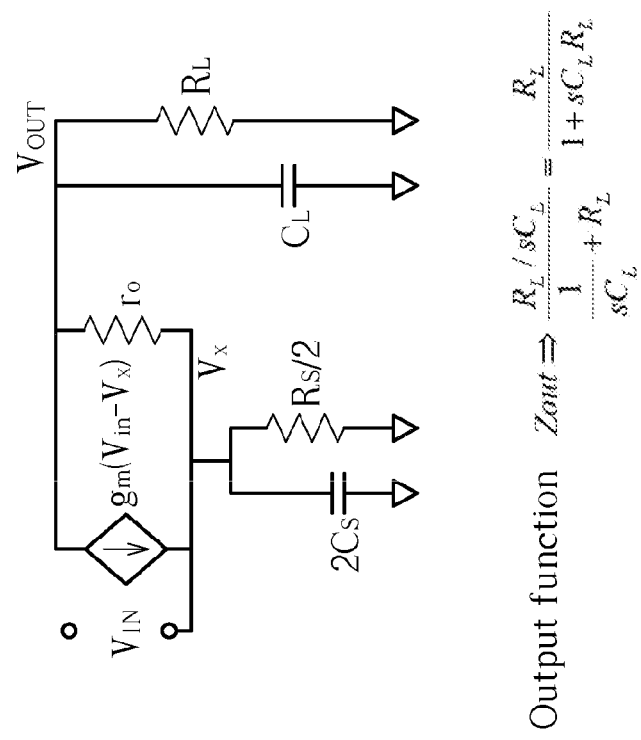
FIG. 2B illustrates a schematic diagram of an equalizer small signal model shown in FIG. 2A according to an embodiment of the present invention.
Figure 2A:
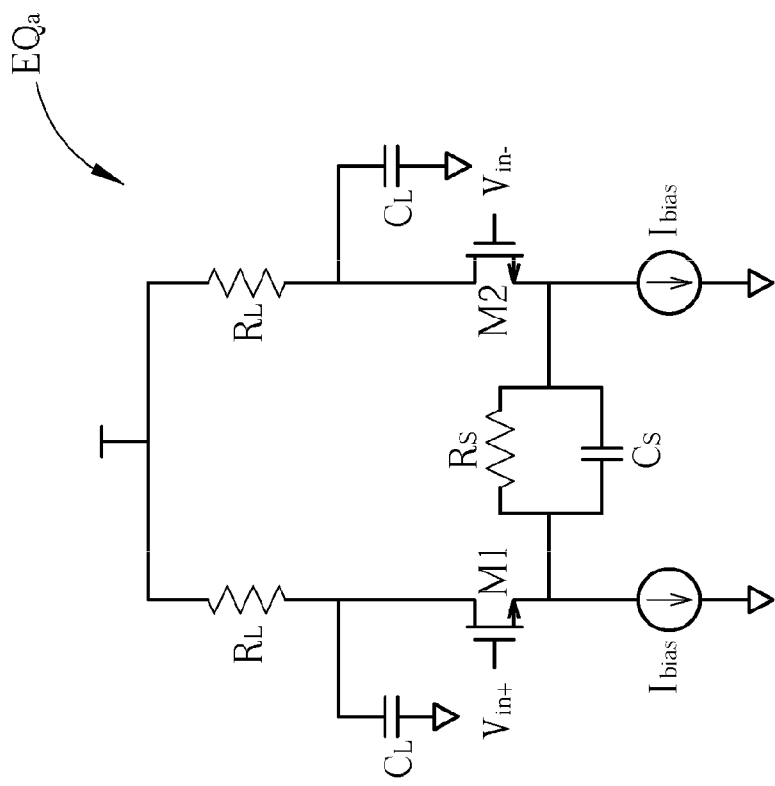
FIG. 2A illustrates a schematic diagram of an equalizer circuit shown in FIG. 1 according to an embodiment of the present invention.

Please refer to FIG. 2A, which illustrates a schematic diagram of a circuit of an equalizer $EQ_a$ for realizing the equalizers $EQ_1$-$EQ_x$ shown in FIG. 1 according to an embodiment of the present invention. The equalizer $EQ_a$ mainly comprises transistors M1, M2, a resistor $R_s$, a capacitor $C_s$ and other elements, such as resistors $R_L$, capacitors $C_L$ and current sources $I_{bias}$. Details of structure and connection manner of the equalizer $EQ_a$ are shown in FIG. 2A, i.e. a gate of the transistor M1 for receiving a positive input voltage $V_{in+}$ of an input signal $IN_a$; a gate of the transistor M2 for receiving a negative input voltage $V_{in-}$ of an input signal $IN_a$; the resistor $R_s$ and the capacitor $C_s$ connected in parallel to be coupled between a drain of the transistor M1 and a drain of the transistor M2, wherein the transistors M1 and M2 are n-type metal oxide semiconductor (MOS) transistors. In such a condition, by properly adjusting a resistance of the resistor $R_s$, the input signal $IN_a$ is compensated, such that the input signal $IN_a$ can be restored to determinable voltage levels to be decoded by the digital logics.

In detail, please refer to FIG. 2B, which illustrates a schematic diagram of a small signal model of the equalizer $EQ_a$ shown in FIG. 2A. Such a skill that converting the circuit of the equalizer $EQ_a$ into the small signal model of the equalizer $EQ_a$ should be well-known by those skilled in the art, and is not narrated hereinafter. A gain $G_m$ and an output function $Z_{out}$ of the equalizer $EQ_a$ can be derived from the small signal model of the equalizer $EQ_a$ shown in FIG. 2B (a resistor $r_o$, a voltage $V_x$ and an output voltage $V_{OUT}$ are indicated in the small signal model of FIG. 2B):

$$G_m \Rightarrow \frac{1/g_m}{1/g_m + \left(\frac{R_s}{2} \parallel \frac{1}{2sC_s}\right)} = \frac{(1+sR_sC_s)g_m}{1+\frac{g_mR_s}{2}+sR_sC_s}$$

$$Z_{out} \Rightarrow \frac{R_L/sC_L}{\frac{1}{sC_L}+R_L} = \frac{R_L}{1+sC_LR_L}$$

Derivation of the gain $G_m$ and the output function $Z_{out}$ should be well-known by those skilled in the art. As can be seen from the above, since the gain Gm for the low frequency component can be approximated to $$G_m \Rightarrow \frac{g_m}{1+\frac{g_mR_s}{2}},$$

that is the equalizer $EQ_a$ can increase decays for the low frequency component of the input signal $IN_a$ as a resistance of the resistor $R_s$ increases. As a result, by properly adjusting the resistance of the resistor $R_s$ to decay the low frequency component of the input signal $IN_a$, the low frequency component of the input signal $IN_a$ and the high frequency component of the input signal $IN_a$ can have similar decays caused by the transmission line $TL_x$, such that the high voltage level of the input signal $IN_a$ can be distinguished from the low voltage level of the input signal $IN_a$, to be decoded by the digital logics.

Figure 2C:
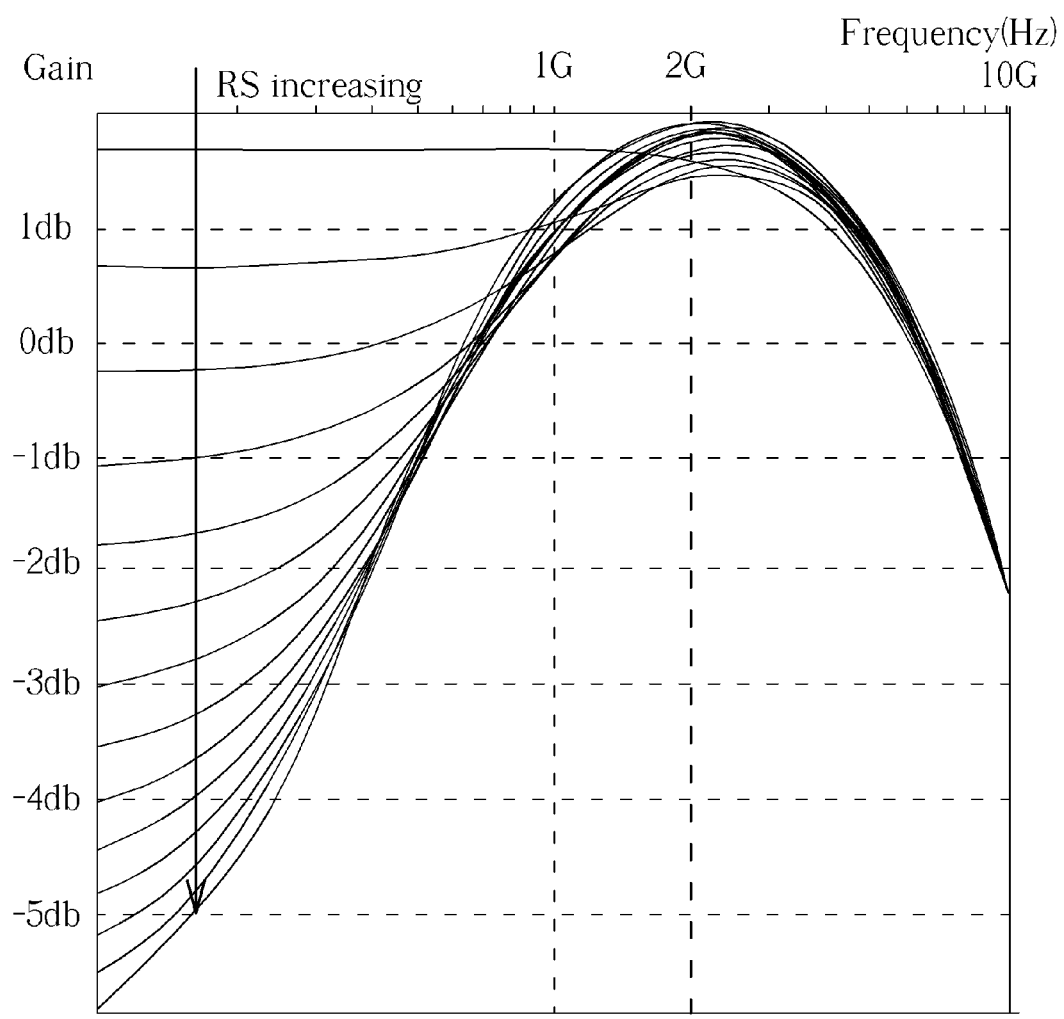
FIG. 2C illustrates a schematic diagram of a frequency response of an equalizer shown in FIG. 2A with different resistances of a resistor according to an embodiment of the present invention.

A frequency response of the equalizer $EQ_a$ can be obtained from the above derivation of the gain $G_m$ and the output function $Z_{out}$. Please refer to FIG. 2C, which illustrates a schematic diagram of a frequency response of the equalizer $EQ_a$ shown in FIG. 2A when the resistor $R_s$ has different resistances according to the present invention. As shown in FIG. 2C, by following an increasing resistance of the resistor $R_s$, the equalizer $EQ_a$ increases the decays of the low frequency component of the input signal $IN_a$ (approximately from 1.7 db to −5.7 db), while the equalizer $EQ_a$ maintains same low gains of the high frequency component of the input signal $IN_a$ (approximately from 1.5 db to 1.9 db). In such a condition, the equalizer $EQ_a$ can select a resistance of the resistor $R_s$ for compensation according to the decays of the high frequency component of the input signal $IN_a$ caused by the transmission line $TL_a$, wherein the selected resistance of the resistor $R_s$ results in decays for the low frequency component of the input signal $IN_a$ similar to those of the high frequency component of the input signal $IN_a$. In other words, when the transmission line $TL_a$ is longer and thus the high frequency component of the input signal $IN_a$ decays more, the equalizer $EQ_a$ selects a larger resistance of the resistor $R_s$ for compensation. Besides, when the transmission line $TL_a$ is shorter and thus the high frequency component of the input signal $IN_a$ decays less, the equalizer $EQ_a$ selects a smaller resistance of the resistor $R_s$ for compensation. As a result, the high voltage level of the input signal $IN_a$ and the low voltage level of the input signal $IN_a$ are distinguishable after compensation, for decoding of the analog to digital conversation.

However, realization of the equalizer $EQ_a$ only provides the low gains for the high frequency component of the input signal $IN_a$, and decays the low frequency component of the input signal $IN_a$, such that the high voltage level of the input signal $IN_a$ is distinguishable from the low voltage level of the input signal $IN_a$. According to that, both energies of the low frequency component of the input signal $IN_a$ and the high frequency component of the input signal $IN_a$ decrease, such that the signal to noise ratio (SNR) is reduced, which causes a false determination in an external environment filled with strong noises. Besides, a dominant pole of the equalizer $EQ_a$ is nearly fixed (approximately at 2 GHz). Therefore, a bandwidth of provided gains for the input signal $IN_a$ is also limited.

Figures 3A, 3B:
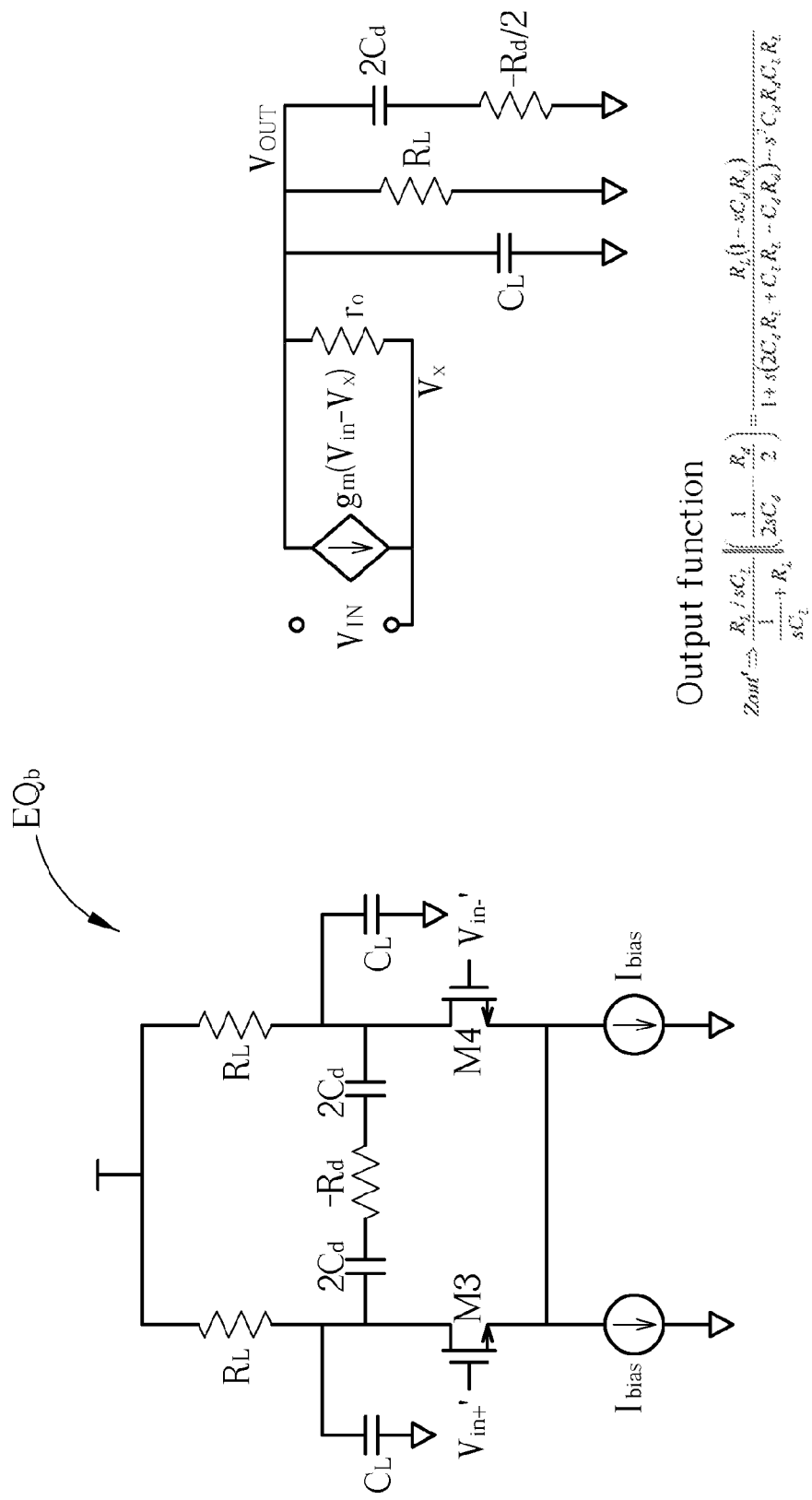
FIG. 3A illustrates a schematic diagram of an equalizer circuit shown in FIG. 1 according to another embodiment of the present invention.
FIG. 3B illustrates a schematic diagram of an equalizer small signal model shown in FIG. 3A according to another embodiment of the present invention.

On the other hand, please refer to FIG. 3A, which illustrates a schematic diagram of a circuit of an equalizer $EQ_b$ for realizing the equalizers $EQ_1$-$EQ_x$ shown in FIG. 1 according to the present invention. The equalizer $EQ_b$ mainly comprises transistors M3, M4, a resistor Rd, at least a capacitor $C_d$ and other elements, such as resistors $R_L$, capacitors $C_L$ and current sources $I_{bias}$, wherein other elements have similar operation and structures with those shown in FIG. 2A and are denoted by the same symbols. The resistor $R_d$ is preferably a negative resistor of a resistance $-R_d$, and the at least one capacitor $C_d$ is preferably at least one capacitor of capacitance $2C_d$.

Details of structure and connection manner of the equalizer $EQ_b$ are shown in FIG. 3B, i.e. a gate of the transistor M3 for receiving a positive input voltage $V_{in+}'$ of an input signal $IN_b$; a gate of the transistor M4 for receiving a negative input voltage $V_{in-}'$ of an input signal $IN_b$, a source of the transistor M4 coupled to the source of the transistor M3; the resistor $R_d$ and the at least one capacitor $C_d$ connected in series to be coupled between a drain of the transistor M3 and a drain of the transistor M4, wherein the transistors M3 and M4 are n-type MOS transistors. In such a condition, by optimizing the resistance $-R_d$ of the resistor $R_d$ to compensate the input signal $IN_b$, the input signal $IN_b$ can be restored to determinable voltage levels to be decoded by the digital logics.

In detail, please refer to FIG. 3B, which illustrates a schematic diagram of a small signal model of the equalizer $EQ_b$ shown in FIG. 3A. Such a skill that converting the circuit of the equalizer $EQ_b$ into a small signal model of the equalizer $EQ_b$ should be well-known by those skilled in the art, and is not narrated hereinafter. Since only connection manners between the transistors M3, M4 and the transistors M1, M2 are different, parameters in the small signal models are denoted by the same symbols. As shown in FIG. 3B, a gain $G_m'$ and an output function $Z_{out}'$ of the equalizer $EQ_b$ can be derived from the small signal model of the equalizer $EQ_b$ (a resistor $r_o$, a voltage $V_x$ and an output voltage $V_{OUT}$ are indicated in the small signal model of FIG. 3B):

$$G_m' \Rightarrow g_m$$

-continued $$Z_{out}' \Rightarrow \frac{R_L/sC_L}{\frac{1}{sC_L}+R_L} \left\| \left(\frac{1}{2sC_d} - \frac{R_d}{2}\right) \right. = \frac{R_L(1-sC_dR_d)}{1+s(2C_dR_L+C_LR_L-C_dR_d)-s^2C_dR_dC_LR_L}$$

Derivation of the gain $G_m'$ and the output function $Z_{out}'$ should be well-known by those skilled in the art. As can be seen from the gain $G_m'$ and the output function $Z_{out}'$, compared with the equalizer $EQ_a$ decaying the low frequency component to narrow an energy difference between the low frequency component and the high frequency component for compensation, the equalizer $EQ_b$ maintains gains of the low frequency component of the input signal $IN_b$ while increasing the gains of the high frequency component of the input signal $IN_b$, to narrow an energy difference between the low frequency component and the high frequency component for compensation. As a result, the resistance $-R_d$ of the resistor $R_d$ can be optimized to increase the gains of the high frequency component of the input signal $IN_b$, such that energies of the low frequency component of the input signal $IN_b$ and the high frequency component of the input signal $IN_b$ transmitted by the transmission line $TL_x$ are similar, so as to distinguish the high voltage level of the input signal $IN_b$ from the low voltage level of the input signal $IN_b$ to be decoded by analog to digital conversion.

Figure 3C:
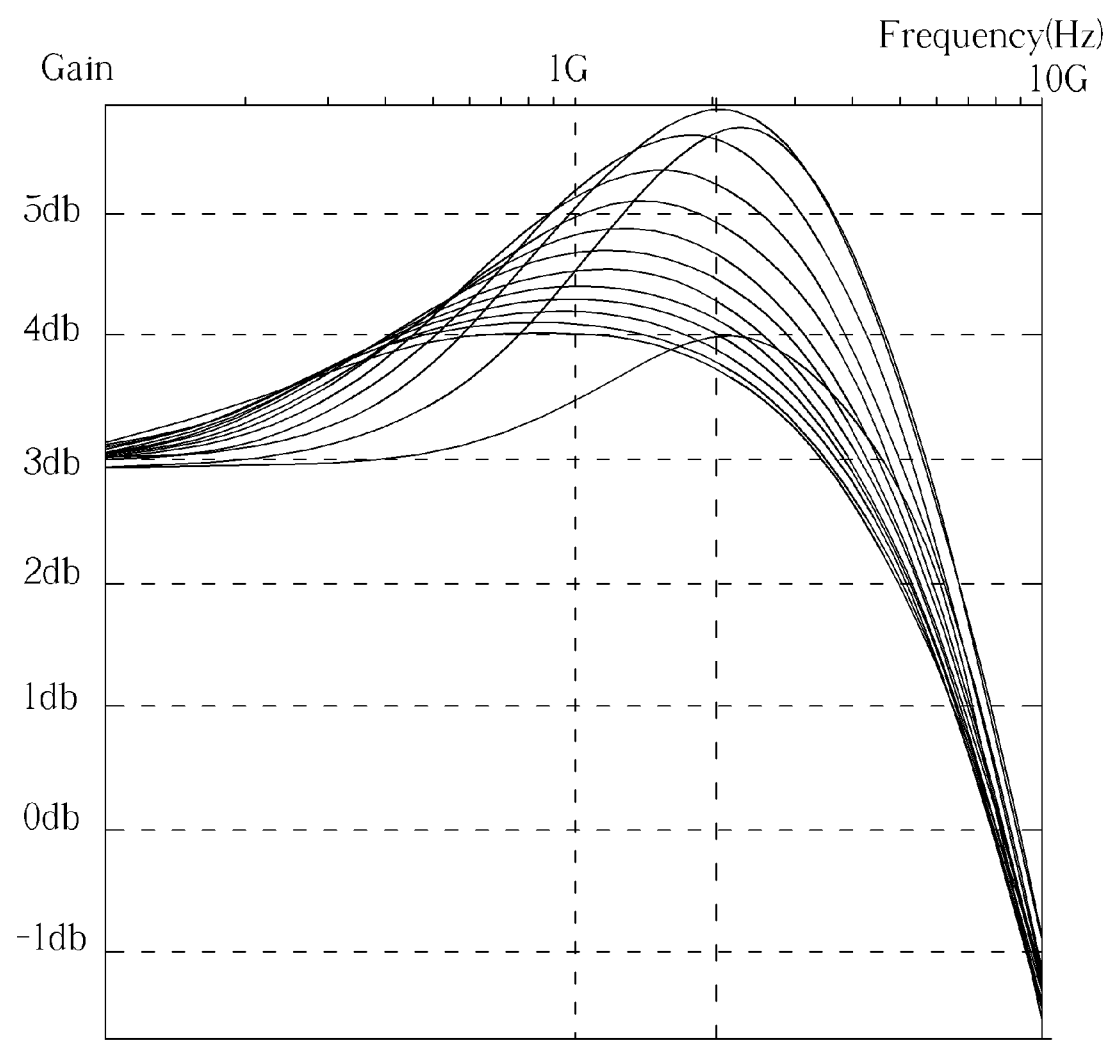
FIG. 3C illustrates a schematic diagram of a frequency response of an equalizer shown in FIG. 3A with different resistances of a resistor according to another embodiment of the present invention.

A frequency response of the equalizer $EQ_b$ can be obtained from the above functions of the gain $G_m'$ and the output function $Z_{out}'$. Please refer to FIG. 3C, which illustrates a schematic diagram of a frequency response of the equalizer $EQ_b$ shown in FIG. 3A when the resistor $R_d$ has different resistances $-R_d$ according to an embodiment of the present invention. As shown in FIG. 3C, when the resistor $R_d$ has different resistances $-R_d$, the equalizer $EQ_b$ can maintain the gains for the low frequency component of the input signal $IN_b$ (approximately from 3 db to 3.5 db), while increasing the gains for the high frequency component of the input signal $IN_b$ (approximately from 4 db to 5.9 db) and adjusting a position of a dominant pole of the high frequency component of the input signal $IN_b$. In such a condition, the equalizer $EQ_b$ optimizes the resistance $-R_d$ of the resistor $R_d$ to increase the gains of the high frequency component of the input signal $IN_b$ according to decays of the high frequency component of the input signal $IN_b$ caused by the transmission line $TL_b$. In other words, when the transmission line $TL_b$ is longer and thus the high frequency component of the input signal $IN_b$ decays more, the equalizer $EQ_b$ optimizes the resistance $-R_d$ of the resistor $R_d$ to provide more the gains for the high frequency component of the input signal $IN_b$ for compensation. In addition, when the transmission line $TL_b$ is shorter and thus the high frequency component of the input signal $IN_b$ decays less, the equalizer $EQ_b$ optimizes the resistance $-R_d$ of the resistor $R_d$ to provide less the gains for the high frequency component of the input signal $IN_b$ for compensation. As a result, since the equalizer $EQ_b$ maintains the gains for the low frequency component of the input signal $IN_b$ while increasing gains for the high frequency component of the input signal $IN_b$ for compensation, the high voltage level of the input signal $IN_b$ and the low voltage level of the input signal $IN_b$ can be distinguished after compensation, to facilitate the decoding of analog to digital conversion, and the SNR is not reduced, such that the equalizer $EQ_b$ can be applied to an environment filled with stronger noises.

Noticeably, the main spirit of the present invention is to provide a structure of the equalizer $EQ_b$ with the resistor $R_d$ and the at least one capacitor $C_d$ connected in series to be coupled between the drain of the transistor M3 and the drain of the transistor M4, to optimize the resistance $-R_d$ of the resistor $R_d$, to maintain the gains of low frequency component of the input signal $IN_b$ while increasing the gains of the high frequency component of the input signal $IN_b$ for compensation, to avoid reducing the SNR. Those skills in the art will readily observe that numerous modifications and alterations of the device and method may be made and are not limited hereinafter. For example, the equalizer $EQ_b$ is preferably utilized in a receiver of a HDMI™ system or a USB™ system, but can also be utilized in other communication systems; the resistor $R_d$ is preferably a negative resistor of a resistance $-R_d$, and can be realized with different negative resistors, as long as the resistance $-R_d$ of the resistor $R_d$ can be optimized to obtain the proper gains and the dominant pole of the high frequency component of the input signal $IN_b$.

Furthermore, as can be seen from the output function $Z_{out}'$, the equalizer $EQ_b$ optimizes the resistance $-R_d$ of the resistor $R_d$ to adjust a position of the dominant pole of the high frequency component of the input signal $IN_b$, and the resistor $R_d$ is preferably a negative resistor of a resistance $-R_d$ for canceling out a component of a resistor $R_L$ of a first order component of a denominator of the output function $Z_{out}'$, to increase the frequency of the dominant pole of the high frequency component of the input signal $IN_b$, so as to increase a frequency bandwidth of the provided gains.

To sum up, for the issue of proper designing an equalizer to compensate the input signal, to restore the input signal to the determinable voltage levels to be decoded by the digital logics, the present invention provides a structure of the equalizer $EQ_b$ which includes the resistor $R_d$ and the at least one capacitor $C_d$ connected in series to be coupled between the drain of the transistor M3 and the drain of the transistor M4. By optimizing the resistance $-R_d$ of the resistor $R_d$, the equalizer $EQ_b$ can maintain the gains of the low frequency component of the input signal $IN_b$ while increasing the gains of the high frequency component of the input signal $IN_b$ for compensation, and thus avoids reducing the SNR. Further, the resistor $R_d$ is preferably a negative resistor of a resistance $-R_d$, which can adjust the position of the dominant pole while increasing the frequency of the dominant pole, so as to increase the frequency bandwidth of the provided gains.

Those skilled in the art will readily observe that numerous modifications and alterations of the device and method may be made while retaining the teachings of the invention.

What is claimed is:

1. An equalizer for compensating an input signal in a receiver of a communication system, wherein the input signal comprises a high frequency component and a low frequency component, the equalizer comprising:
    a first transistor, comprising a gate, a drain and a source, the gate for receiving a positive input voltage of the input signal;
    a second transistor, comprising a gate, a drain and a source, the gate for receiving a negative input voltage of the input signal, and the source is coupled to the source of the first transistor; and
    a resistor, connected with at least one capacitor in series to be coupled between the drain of the first transistor and the drain of the second transistor, having a resistance.

2. The equalizer of the claim 1, wherein the resistor maintains a gain of the low frequency component as well as to increase a gain of the high frequency component to adjust a dominant pole.

3. The equalizer of the claim 1, wherein the resistor is a negative resistor for increasing a frequency of the dominant pole.

4. The equalizer of the claim 1, wherein the resistor increases a gain of the high frequency component.

5. A communication system comprises:
a transmitter for transmitting at least one input signal;
at least one transmission line, coupled to the transmitter, for transmitting at least one input signal, respectively; and
a receiver comprising:
at least one equalizer, coupled to the at least one transmission line, respectively, each equalizer for compensating a corresponding input signal, which comprises a high frequency component and a low frequency component, the each equalizer comprising:
a first transistor, comprising a gate, a drain and a source, the gate for receiving a positive input voltage of the input signal;
a second transistor, comprising a gate, a drain and a source, the gate for receiving a negative input voltage of the input signal, and the source is coupled to the source of the first transistor; and
a resistor, connected with at least one capacitor in series to be coupled between the drain of the first transistor and the drain of the second transistor, having a resistance; and
a processing unit, for compensating the at least one input signal transmitted through the at least one equalizer.

6. The communication system of the claim 5, wherein the resistor maintains a gain of the low frequency component as well as to increase a gain of the high frequency component to adjust a dominant pole.

7. The communication system of the claim 5, wherein the resistor is a negative resistor for increasing a frequency of the dominant pole.

8. The communication system of the claim 5, wherein the resistor increases a gain of the high frequency component.

* * * * *